(12) United States Patent
Raynor

(10) Patent No.: US 11,568,834 B2
(45) Date of Patent: Jan. 31, 2023

(54) METHOD AND DEVICE FOR AMBIENT LIGHT MEASUREMENT

(71) Applicant: STMICROELECTRONICS (RESEARCH & DEVELOPMENT) LIMITED, Marlow (GB)

(72) Inventor: Jeffrey M. Raynor, Edinburgh (GB)

(73) Assignee: STMICROELECTRONICS (RESEARCH & DEVELOPMENT) LIMITED, Marlow (GB)

(*) Notice: Subject to any disclaimer, the term of this patent is extended or adjusted under 35 U.S.C. 154(b) by 114 days.

(21) Appl. No.: 17/144,357

(22) Filed: Jan. 8, 2021

(65) Prior Publication Data
US 2021/0233493 A1 Jul. 29, 2021

(30) Foreign Application Priority Data
Jan. 24, 2020 (EP) .................... 20153603

(51) Int. Cl.
*G09G 5/10* (2006.01)
*G09G 3/3225* (2016.01)

(52) U.S. Cl.
CPC ............ *G09G 5/10* (2013.01); *G09G 3/3225* (2013.01); *G09G 2360/141* (2013.01); *G09G 2360/144* (2013.01); *G09G 2360/145* (2013.01)

(58) Field of Classification Search
CPC .. G09G 5/10; G09G 3/3225; G09G 2360/141; G09G 2360/144; G09G 2360/145; G09G 2360/142; G09G 2360/148
See application file for complete search history.

(56) References Cited

U.S. PATENT DOCUMENTS

| | | | |
|---|---|---|---|
| 9,927,291 B2 | 3/2018 | Mellot | |
| 2005/0156496 A1* | 7/2005 | Takashima | C09K 11/7734 313/237 |
| 2009/0152445 A1 | 6/2009 | Gardner, Jr. | |
| 2010/0277786 A1* | 11/2010 | Anderson | G02F 1/1313 359/485.05 |
| 2012/0026139 A1* | 2/2012 | Chou | G09G 3/3406 345/207 |
| 2017/0061898 A1* | 3/2017 | Takayanagi | H05B 47/11 |
| 2017/0229059 A1* | 8/2017 | Bonnier | G06F 3/017 |
| 2018/0017834 A1* | 1/2018 | Neuman | G02B 27/01 |
| 2018/0063435 A1* | 3/2018 | Cho | H04N 5/23274 |
| 2018/0211607 A1* | 7/2018 | Kabacinski | G09G 3/20 |

(Continued)

OTHER PUBLICATIONS

AUTOSAR, "E2E Protocol Specification", AUTOSAR FO R19-11, Mar. 29, 2019, 185 pages.

(Continued)

*Primary Examiner* — Yuzhen Shen
(74) *Attorney, Agent, or Firm* — Slater Matsil, LLP

(57) ABSTRACT

An embodiment method of measuring ambient light comprises generating, by an ambient light sensor associated with a screen which alternates between first phases in which light is emitted and second phases in which no light is emitted by the screen, a first signal representative of an intensity of light received by the ambient light sensor during the first and second phases; comparing the first signal with a threshold intensity value; and controlling a timing of an ambient light measurement by the light sensor based on the comparison.

21 Claims, 6 Drawing Sheets

(56) References Cited

U.S. PATENT DOCUMENTS

| | | | |
|---|---|---|---|
| 2018/0263091 A1 | 9/2018 | Daman et al. | |
| 2018/0348049 A1* | 12/2018 | Yoon | G09G 3/3208 |
| 2020/0348170 A1 | 11/2020 | Maucotel | |
| 2021/0241721 A1* | 8/2021 | Matsumoto | G06F 3/041 |

OTHER PUBLICATIONS

Afonin, Oleg, "iPhone X Eye Strain: How to Stop OLED Flickering in Just Three Clicks," Breaking into iOS 11, https://blog.elcomsoft.com/2018/03/iphone-x-eye-strain-how-to-stop-oled-flickering-in-just-three-clicks/, Mar. 5, 2018, 17 pages.

Barber, Kevin, "Change in Coming to Smartphone Displays," Blog, https://www.synaptics.com/company/blog/OLED-LCD, Apr. 4, 2017, 5 pages.

Bugetlightforum, "PWM and Smartphones, AMOLED flaw?," http://budgetlightforum.com/node/52628, Feb. 9, 2017, 7 pages.

Delisle, Jean-Jacques, "New OLED display drivers advance smartphone designs, The advancement is set to usher in a new age of smartphone OLED displays," https://www.electronicproducts.com/Optoelectronics/Displays/New_OLED_display_drivers_advance_smartphone_designs.aspx, May 15, 2018, 3 pages.

Electrical Engineering, "Implementing a very high frame rate (~1Khz) OLED display," Electrical Engineering Stack Exchange, https://electronics.stackexchange.com/questions/64073/implementing-a-very-high-frame-rate-1khz-oled-display, Apr. 2013, 6 pages.

Happich, Julien, "40nm OLED display driver integrated circuit targets smartphone displays without bezels," http://www.eenewsled.com/news/40nm-oled-display-driver-integrated-circuit-targets-smartphone-displays-without-bezels, May 2, 2018, 1 page.

Hurd, David "Synaptics Now Sampling Two New ClearView OLED display Driver ICs," Synaptics, https://www.synaptics.com/company/news/R66455-R66451, Dec. 12, 2017, 3 pages.

Mertens, Ron, "Pulse-width modulation (PWM) in OLED displays," https://www.oled-info.com/pulse-width-modulation-pwm-oled-displays, Jan. 14, 2018, 6 pages.

"PWM Ranking—The Best Displays for the Eyes," https://www.notebookcheck.net/PWM-Ranking-Notebooks-Smartphones-and-Tablets-with-PWM.163979.0.html, Apr. 19, 2016, 43 pages.

Solviev, Anton et al., "Overview of the smartphone Apple iPhone X: the latest flagship with an almost frameless OLED," https://www.ixbt.com/mobile/ap, Nov. 1, 2017, 52 pages.

Wei, Mao-Kuo et al., "Emission Characteristics of Organic Light-Emitting Diodes and Organic Thin-Films with Planar and Corrugated Structures," International Journal of Molecular Sciences, 11(4), pp. 1527-1545, https://www.ncbi.nlm.nih.gov/pmc/articles/PMC2871129/, Apr. 12, 2010.

Wootever, "[KERNEL][G955} AMOLED PWM Flickerfree," XDA, https://forum.xda-developers.com/galaxy-s8+/development/amoled-pwm-s8-t3716663, Dec. 8, 2017, 11 pages.

* cited by examiner

A

B

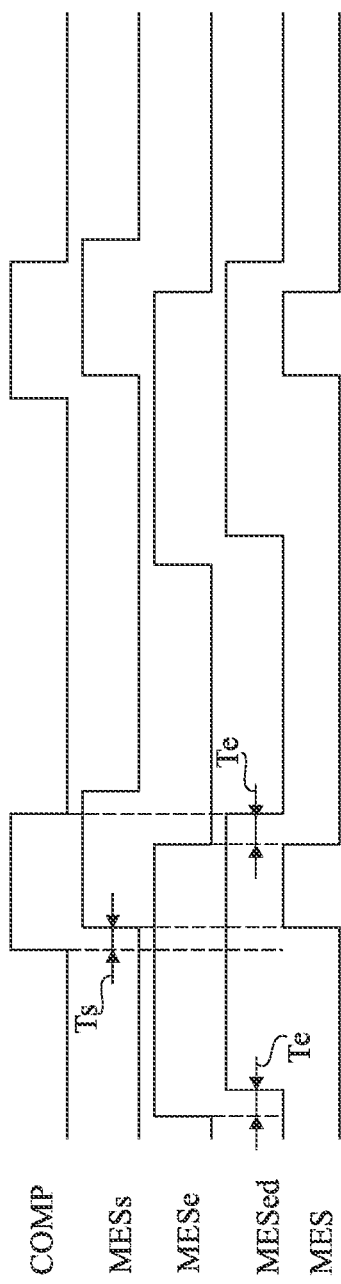

METHOD AND DEVICE FOR AMBIENT LIGHT MEASUREMENT

CROSS-REFERENCE TO RELATED APPLICATIONS

This application claims the benefit of European Application No. 20153603.4, filed on Jan. 24, 2020, which application is hereby incorporated herein by reference.

TECHNICAL FIELD

The present disclosure relates generally to electronics systems and methods, and more specifically to electronic systems that comprise an ambient light sensor and to methods of measuring ambient light with such systems.

BACKGROUND

Electronic systems such as mobile telephones or tablets comprising screens displaying information and/or images destined for a user of the system are known.

In such systems, the light power emitted by the screen can be at least partly adapted as a function of the level of ambient light, this level of ambient light being measured by means of an ambient light sensor (ALS). For example, this ambient light measurement is used to adjust the light power emitted by the screen as a function of the level of ambient light for a better perception of image displayed on the screen by the human eye, as well as to save energy, and thus extend the life of a battery supplying the screen.

In known electronic systems comprising a screen and an ambient light sensor for measuring the intensity of the surrounding or ambient light, the sensor is disposed under a protective glass covering the screen, under a dedicated opening in the screen. It would be desirable to position the sensor under the screen, without a dedicated opening in the screen, the sensor capturing the weak transmission of the light through the screen. However, it is then difficult for the sensor to distinguish with precision the light emitted by the screen in the direction of the sensor from the ambient light passing through the screen from the exterior to the sensor.

SUMMARY

There is a need to address all or some of the drawbacks of the known electronic systems comprising a screen and a light sensor for measuring the level of ambient light surrounding the system.

Thus, one embodiment addresses all or some of the drawbacks of the known electronic systems comprising a screen and a light sensor for measuring the level of ambient light surrounding the system.

In particular, one embodiment makes it possible to avoid that the level of ambient light measured by the light sensor is distorted by the light emitted by the screen.

One embodiment provides a method of measuring ambient light comprising: generating, by an ambient light sensor associated with a screen which alternates between first phases in which light is emitted by the screen, a part of which is received by the ambient light sensor, and second phases in which no light is emitted by the screen, a first signal representative of an intensity of light received by the ambient light sensor during the first and second phases; comparing the first signal with a threshold intensity value; and controlling a timing of an ambient light measurement by the light sensor based on the comparison.

According to an embodiment, comparing the first signal with the threshold intensity value comprises generating a second signal having a first state when the intensity of the light received by the ambient light sensor is below the threshold intensity value, and a second state when the intensity of light received by the ambient light sensor is above the threshold intensity value, and wherein a start of the measurement is triggered by at least one transition of the second signal to the first state such that the measurement starts when the second signal is in the first state, and a duration of the measurement is controlled based on at least one duration of the first state of the second signal.

According to an embodiment, the measurement starts following a first transition of the second signal to the first state.

According to an embodiment, the measurement starts a time delay between 0.1 μs and 100 μs after the first transition.

According to an embodiment, the first transition triggers the start of the measurement, and a next transition of the second signal to the second state following the first transition ends the measurement.

According to an embodiment, the duration of the measurement is controlled based on at least one previous duration of the first state of the second signal.

According to an embodiment, the duration of the measurement is controlled to be shorter than the at least one previous duration of the first state of the second signal.

According to an embodiment, the duration of the measurement is controlled based on an average value of at least two successive previous durations of the first state of the second signal.

According to an embodiment, the at least one previous duration of the first state of the second signal comprises the previous duration of the first state of the second signal immediately preceding the first state of the second signal during which the measurement starts.

According to an embodiment, the method comprises counting a number of clock cycles with a counter during the at least one previous duration of the first state of the second signal, the duration of the measurement being controlled based on the counted number of clock cycles.

According to an embodiment, the duration of the measurement is equal to a duration of a first number of successive clock cycles, the first number being lower than the counted number of clock cycles.

According to an embodiment, the first signal is generated based on an output signal of at least one pixel of a plurality of pixels of the ambient light sensor.

According to an embodiment, the threshold intensity value is determined such that the second signal is in the first state during each second phase, and in the second state during each first phase.

One embodiment provides an ambient light sensor configured to perform the described method.

One embodiment provides an electronic device comprising: a screen; a screen driver configured to control the screen to alternate between first phases in which light is emitted by the screen and second phases in which no light is emitted by the screen; and the ambient light sensor defined above disposed such that a part of the light emitted by the screen is received by the ambient light sensor.

According to an embodiment, the ambient light sensor is disposed at a first side of the screen opposite a second side of the screen from which the light is emitted, and wherein, preferably, a transmittance of the ambient light through the screen is in a range from 0.5% to 5% when no light is emitted by the screen.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 8 is a timing diagram illustrating a mode of operation of the circuit of FIG. 7.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the following disclosure, electronic systems are considered in which the screen operates by alternating phases in which the screen emits light and phases in which the screen is turned off, i.e. the screen emits no light. In such systems, the average light power emitted by the screen and perceived by a user is adapted by modifying the duty cycle and/or the frequency of the screen activation, for example by adjusting the duration of the phases of light emission and/or the duration of the phases in which no light is emitted. With adequate switching frequencies between the phases in which the screen emits light and the phases in which the screen is turned off, the user of the screen does not perceive the transitions between these phases, due to the persistence of vision of the human eye. For example, the switching frequency is at least 25 Hz.

For instance, the screen is controlled by a binary control signal, a first state of which causes a phase of light emission by the screen, and a second state of which causes a phase in which no light is emitted by the screen. This control signal generally undergoes pulse-width modulation (PWM) or pulse-frequency modulation (PFM). The type of screen, for example LCD (Liquid Crystal Display) or OLED (Organic Light Emitting Diode), to which such control modes apply and the manner of implementation of these control modes are not described in detail. The described embodiments are compatible with these known control modes and the known screens to which these control modes apply.

Figure 1:
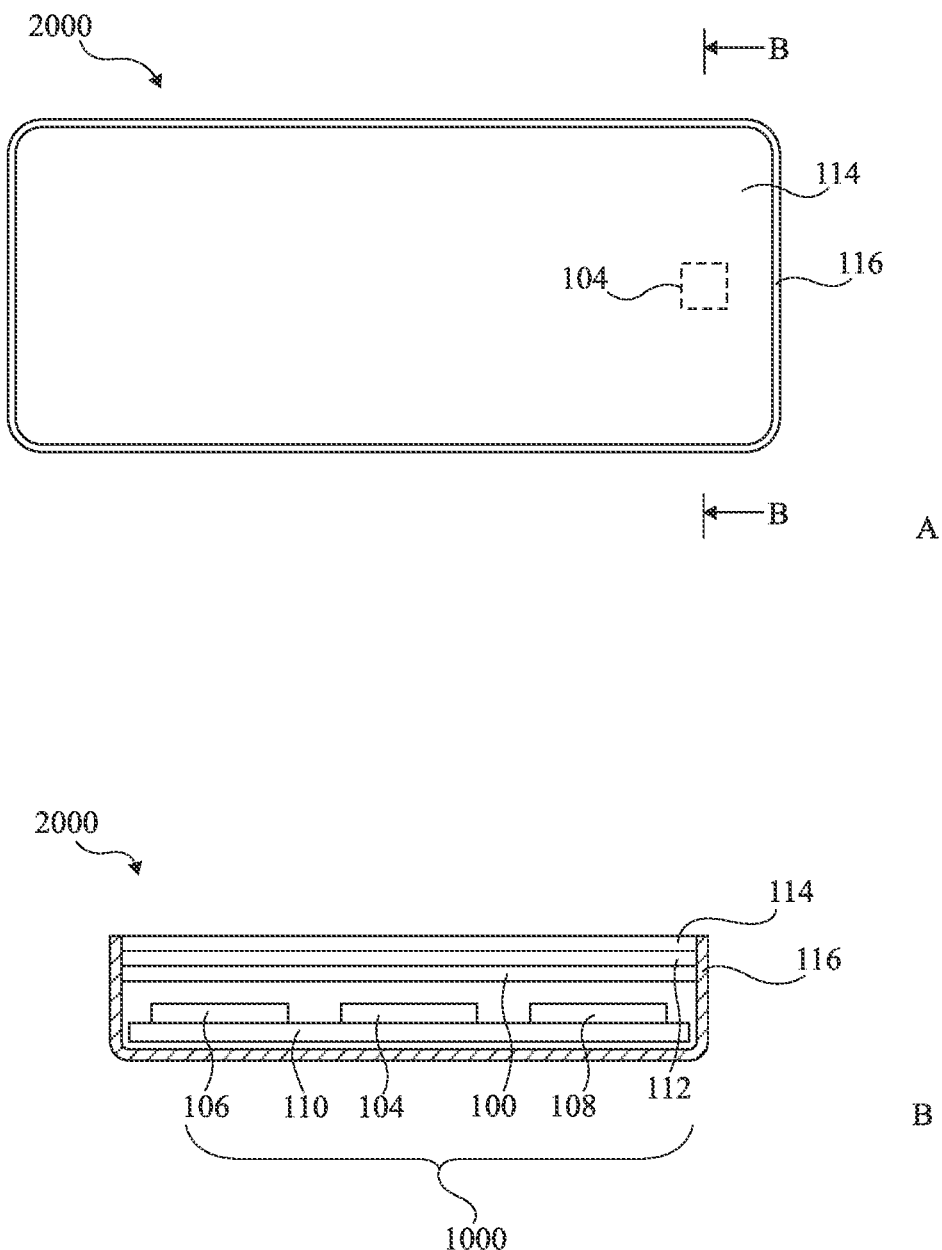
FIG. 1 illustrates, in front and cross-section views, an embodiment of an electronic device.

FIG. 1 illustrates two views A and B of an embodiment of an electronic device 2000, in this example a mobile telephone 2000, the view A being a front view of the telephone 2000 and the view B being a cross-section view along the plane BB indicated in view A.

The device 2000 comprises an electronic system or circuit 1000. The electronic circuit 1000 comprises a screen 100 configured to display images and/or information destined for a user. The display screen, or panel, 100 comprises a matrix of light emitting pixels (not illustrated).

The system 1000 further comprises various electronic circuits including an ambient light sensor 104. In the example shown in FIG. 1, in the view B, two further electronic circuits, namely a processing unit 106 and a driver or control circuit 108 of the screen 100, are illustrated.

The various electronic circuits of the system 1000 are, for example, mounted on a printed circuit board (PCB) 110, preferably a flexible printed circuit board, in order to be electrically coupled with one another via the board 110. Although a single board 110 is illustrated in the view B shown in FIG. 1, the system 1000 can comprise a plurality of boards 110, possibly electrically coupled with one another via ribbon cables.

For instance, the display screen 100 can be of the OLED type (Organic Light Emitting Diode). The screen 100 is thus, for example, controlled by a binary control signal, for example generated by the driver 108. This control signal is, for example, provided selectively to each diode of the screen, so as to cause alternate phases in which at least certain diodes of the screen 100 emit light and phases in which no diode of the screen 100 emits light. The selection of the diodes of the screen 100 receiving or not receiving the control signal is, for example, implemented by the driver 108. In certain cases, the driver 108 can further adapt, for each diode, the voltage level of the binary signal corresponding to a phase of light emission so as to adapt the light power emitted by the diode. Each pixel of the screen can consist of one or more diodes, possibly covered by an RGB (Red, Green, Blue) color filter.

For instance, the display screen 100 can also be of the LCD type (Liquid Crystal Display). The screen 100 thus comprises, for example, a matrix of pixels each comprising polarizing liquid crystal filters, and an illuminating plate or panel disposed under the matrix of pixels. The plate is, for example, controlled by a binary control signal, for example generated by the driver 108, so that the plate operates by alternating phases of light emission and phases in which the plate does not emit any light. In certain cases, the driver 108 can further adapt the voltage level of the binary signal corresponding to a phase of light emission so as to adapt the light power emitted by the plate. The polarizing filters of each pixel are controlled, for example by the driver 108 of the screen 100, to allow or prevent the light emitted by the plate to pass through the polarizing filters, towards a user. Each pixel of the screen can be covered by one or more RGB color filters.

In the illustrated example, the system 1000 further comprises, above the display screen 100, a touch screen or touch plate 112. The touch screen 112 entirely covers the display screen 100, the screens 100 and 112 having substantially the same surface areas, preferably the same surface areas.

Typically, the device 2000 comprises a protective glass pane 114 covering the screen 100, and, more specifically in this example, the assembly comprising the two screens 100 and 112. The glass pane 114 entirely covers the screen 100, the surface area of the glass pane 114 being substantially equal to that of the screen 100, preferably equal to that of the screen 100.

The device 2000 comprises a housing, or shell, 116, in which the system 1000 is disposed, i.e. in which the electronic circuits 104, 106 and 108 and the one or more boards 110 are disposed. The assembly of the screen 100, the optional touch screen 112 and the glass pane 114 closes the housing 116 on the side of a face of the system, the upper face in the view B of FIG. 1, and the face that is visible in the view A of FIG. 1.

In this embodiment, the telephone 2000 is called "borderless", i.e. the screen 100, and more specifically the assembly of the screen 100, the optional touch screen 112 and the glass pane 114, occupies substantially the entire face, preferably the entire face, of the device intended to be viewed by the user of the system, i.e. the upper face of the device 2000 in the view B of FIG. 1. The ambient light sensor 104 is thus disposed under the screen 100, i.e. on the side of the screen 100 opposite the face of the screen 100 from which light is emitted by the screen. The display screen 100, the optional touch screen 112 and the glass pane 114 are thus at least partially transparent to the ambient light, the ambient light for example corresponding here to the visible light and possibly to infra-red and/or ultra-violet light. Thus, ambient light can pass through the assembly of the glass pane 114, the optional touch screen 112 and the display screen 100, and reach the sensor 104.

Figure 2:
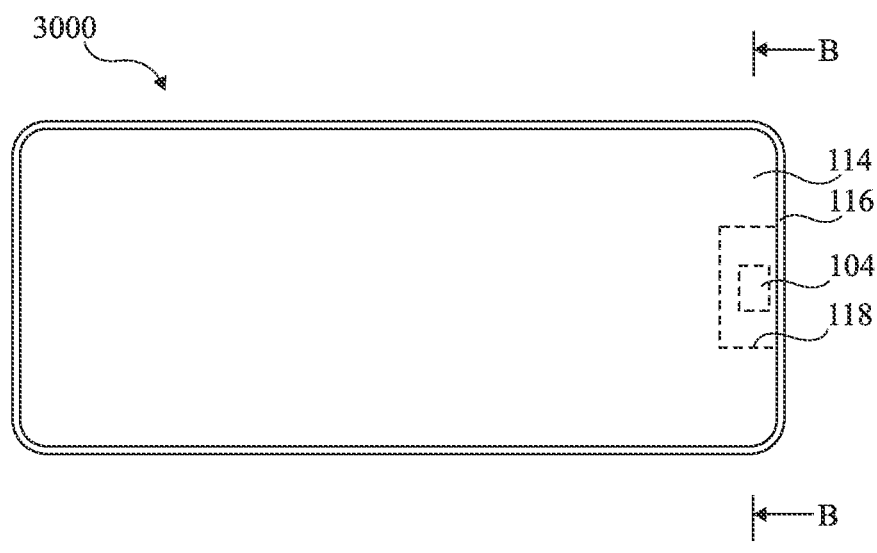
FIG. 2 illustrates, in front and cross-section views, a further embodiment of an electronic device.
Figure 2:
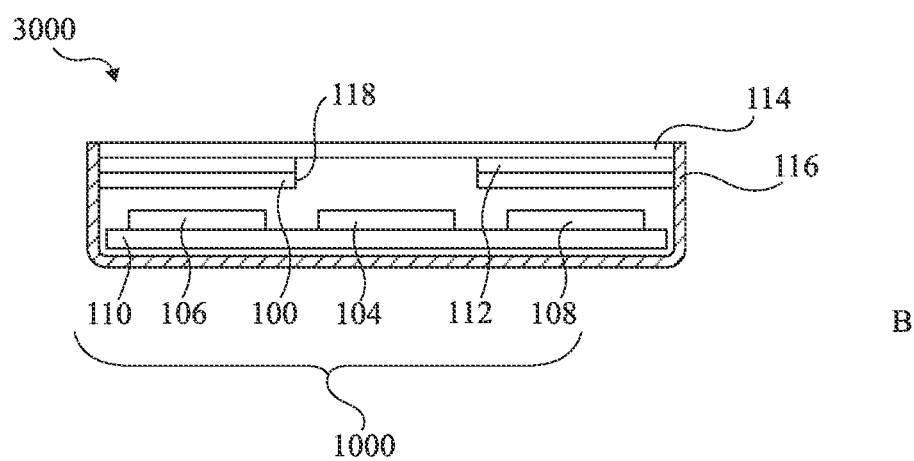

FIG. 2 illustrates two views A and B of a further embodiment of an electronic device 3000, in this example a mobile telephone 3000, the view A being a front view of the telephone and the view B being a cross-section view along the plane BB indicated in view A.

The device 3000 of FIG. 2 differs from the device 2000 of FIG. 1 in that the display screen 100 and the optional touch screen 112 are interrupted above the sensor 104 in order to allow the ambient light to reach the sensor 104. More specifically, a window, or a notch, 118 is provided through the screen 100 and the optional touch screen 112, above the sensor 104. The glass pane 114 covers the window 118 so as to protect the electronic circuits disposed in the housing 116, and in particular the sensor 104.

For example, in the devices 2000 and 3000, during a phase in which the screen is turned off, and, thus, no light is emitted by the screen, the transmittance of the light through the assembly of the glass pane 114, the optional touch screen 114 and the display screen 112 is in the range from 0.5% to 5%.

It should be noted that the devices 2000 and 3000 are illustrated in a very schematic fashion, and that not all details of these devices have been illustrated. The embodiments that will be described in the following are not limited to the example devices shown in FIGS. 1 and 2, but apply to all electronic devices comprising an electronic system 1000, for example tablet computers, connected watches, computer screens, mobile telephones, multimedia apparatus equipped with, for example, a flexible or foldable screen, etc. More specifically, the described embodiments apply to electronic systems 1000 comprising a display screen 100 and an ambient light sensor 104 disposed under the screen 100 as illustrated in FIG. 1, or under a window, or opening, 118 of the screen 100 as illustrated in FIG. 2, in which the screen 100 operates by alternating phases of light emission and phases in which no light is emitted.

Figure 3:
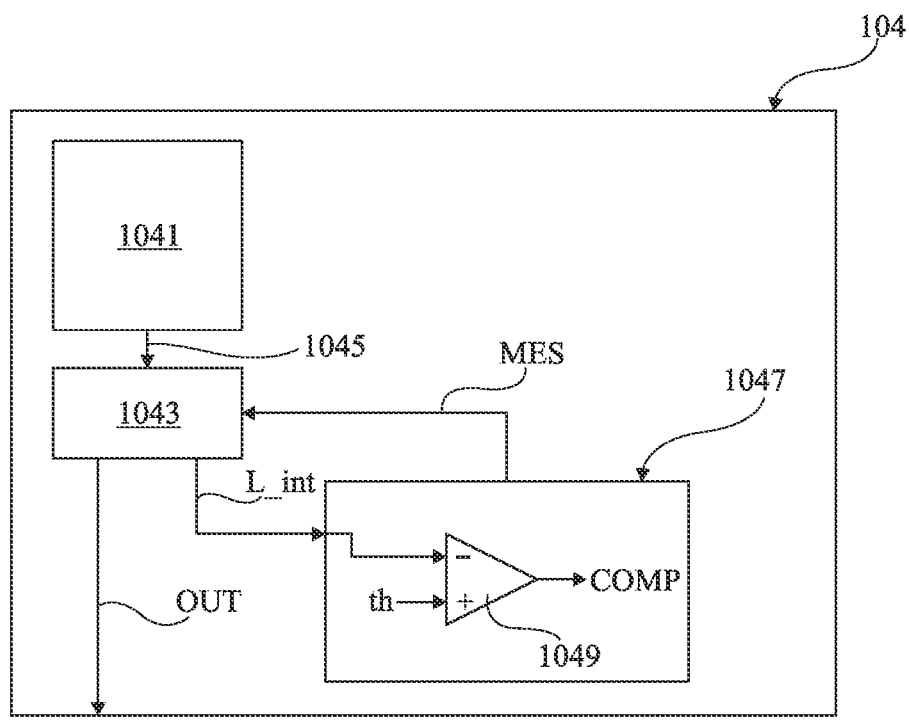
FIG. 3 schematically illustrates, in the form of blocks, a light sensor of the device of FIG. 1 or 2.

FIG. 3 schematically illustrates, in the form of blocks, the light sensor 104 of the device of FIG. 1 or 2.

The ambient light sensor 104 for example comprises a light sensitive area 1041 comprising at least one pixel (not shown) receiving light. Preferably, the area 1041 comprises more than one pixel. Each pixel of the area 1041 provides an output signal 1045.

For instance, the output signal 1045 of a pixel is an analog signal, the value of which being for example representative of a value of a photocurrent generated by a photodiode of the pixel. Although this is not shown, the output signal of the pixel is for example provided by a transimpedance amplifier; a source follower transistor having its gate coupled to a buffering capacitor in which a voltage representative of the charges photogenerated in the photodiode are stored; or a charge integrator converting the photogenerated charges in the photodiode into a rising voltage. The output signal could also be provided by a readout circuit of the pixel as for example described in the application U.S. Pat. No. 9,927, 291, the content of which being hereby incorporated by reference in its entirety.

The output signal 1045 of a pixel could also be a binary signal having a pulse each time a photon received by a single-photon avalanche diode (SPAD) of the pixel triggers an avalanche phenomenon, or a voltage having a value representative of the number of pulses generated for a given time period.

The light sensor 104 comprises a read circuit 1043. The read circuit 1043 is configured to receive the output signals 1045 of the pixels of the area 1041. In this embodiment, the read circuit 1043 is further configured to provide, or generate, an output signal OUT of the sensor 104, based on the signals 1045. The signal OUT, which is for example a digital signal comprising a plurality of bits, is representative of the amount of light received by the area 1041 during a given measurement phase, and thus of the amount of light received by the sensor 104 during this given measurement phase.

For instance, all the pixels of the sensor 104 are configured to receive light in a same and single wavelength range, and the signal OUT is representative of the amount of light received during a measurement phase in this single wavelength range.

The pixels of the sensor 104 could also be separated in a plurality of sets of pixels such that, in each set of pixels, the pixels of the set are configured to receive light only in a given corresponding range of wavelengths, different from the ranges of wavelength of the other sets of pixels, for example by associating each pixel of each set of pixels with corresponding filters adapted to the range of wavelengths of this set of pixels. The signal OUT can thus be representative of the amount of light received during a measurement phase, in each of the plurality of wavelength ranges corresponding to the plurality of sets of pixels. With such an signal OUT, the system 1000 (FIG. 1 or 2) can be configured to determine the type of ambient light, for example if the light is natural, from a filament light bulb, from a fluorescent light bulb, if the light is a cold or warm light, etc., based on the spectral repartition of the light between each of the plurality of wavelength ranges. Furthermore, in the case where the screen 100 is a colour screen of the OLED type, the processing unit 106 and/or the driver 108 (FIG. 1 or 2) can thus be configured to control the screen 100 such that, for each wavelength range that the screen 100 can emit, the screen 100 receives an indication of the average target power that the screen 100 needs to emit for this wavelength range. Indeed, in the case of an OLED colour screen, the circuit 108 is generally configured to control each pixel of the screen individually. As a result, the system 1000 can thus adapt the type of light emitted by its screen 100 to the type of ambient light which surrounds the system 1000.

The read circuit 1043 is further configured to provide, or generate, a signal L_int based on the signals 1045 coming from at least certain pixels of the area 1041, the signal L_int being preferably an analog signal. The signal L_int is representative of the intensity of light received by the sensor 104, and, more precisely, by the area 1041 of the sensor 104, during the sensor 104 operation. In other words, the value of the signal L_int changes when the intensity of the light received by the sensor 104 changes. For example, the value of the signal L_int is updated such that a time period between each two successive values of the signal L_int is at least 10 times, preferably 100 times, shorter than the minimal time duration of the phases in which no light is emitted by the screen 100.

For instance, in the case where each signal 1045 is a photocurrent generated by one of the photodiodes of the pixels of the area 1041, the value of signal L_int can correspond to a mean value of the values of the signals 1045.

For instance, in the case where each signal 1045 presents a pulse for each avalanche phenomenon occurring in a SPAD of the pixel corresponding to the signal 1045, the value of the signal L_int can be representative of the number of pulses received by the read circuit 1043 for a given time duration among successive periodic time durations. In such a case, the value of the signals 1045, and thus the value of the signal L_int, is updated at the end of each of these successive periodic time durations.

The read circuit 1043 is under the control of a binary control signal MES, such that, for each ambient light measurement phase, a start and an end of the measurement phase, and thus its duration, are determined based on the signal MES. The circuit 1043 comprises an input configured to receive the signal MES. Each time the signal MES is in a first state, for example a high state, an ambient light measurement phase is performed by the sensor 104. The start of each ambient light measurement is triggered by a transition of the signal MES to its first state, and the end of the ambient light measurement is triggered by a next transition of the signal MES to its second state, for example a low state.

The sensor 104 further comprises a control circuit 1047. The control circuit 1047 comprises an input configured to receive the signal L_int, and an output configured to provide the signal MES. The control circuit 1047 is configured to generate, or provide, the signal MES based on the signal L_int. Thus, the circuit 1047 controls, by mean of signal MES, timings of each ambient light measurement phase, that is to say the start and the end of the ambient light measurement phase. The circuit 1047 is configured such that the ambient light measurement occurs during a phase in which no light is emitted by the screen 100.

For example, the circuit 1047 is configured to compare the value of the signal L_int with a threshold intensity value th. The circuit 1047 is, for example, further configured to generate a binary signal COMP representative of the result of the comparison of the signal L_int with the threshold intensity value th. The threshold intensity value th is chosen such that the state of the signal COMP indicates whether the screen 100 is emitting light or not.

A first state, for example a high state, of the signal COMP indicates that the value of intensity of the light received by the sensor 104 is below a threshold determined based on the threshold intensity value th, the signal COMP being in its first state when, for example, the signal L_int is below the threshold th. A second state, for example a low state, of the signal COMP indicates that the value of intensity of the light received by the sensor 104 is above the threshold determined based on the threshold intensity value th, the signal COMP being in its second state when, for example, the signal L_int is above the threshold th. The threshold intensity value th is chosen such that the first state of the signal COMP indicates that no light is emitted by screen 100, and the second state of the signal COMP indicates that screen 100 is emitting light and that a part of this emitted light is received by the sensor 104.

For example, the circuit 1047 comprises a circuit, or comparator, 1049 configured to compare the signal L_int with the threshold intensity value th, and generate the COMP signal accordingly. For example, the comparator 1049 comprises a first input, for example a negative input (−), configured to receive the signal L_int, a second input, for example a positive input (+), configured to receive the threshold intensity value th, and an output configured to generate the COMP signal.

The circuit 1047 is then configured to generate the signal MES based on the signal COMP, such that an ambient light measurement is performed during a corresponding phase in which no light is emitted by the screen 100. By doing this, value of the measured ambient light is not distorted by the light emitted by the screen 100 to the sensor 104 during the phases in which light is emitted by the screen 100.

Figure 4:
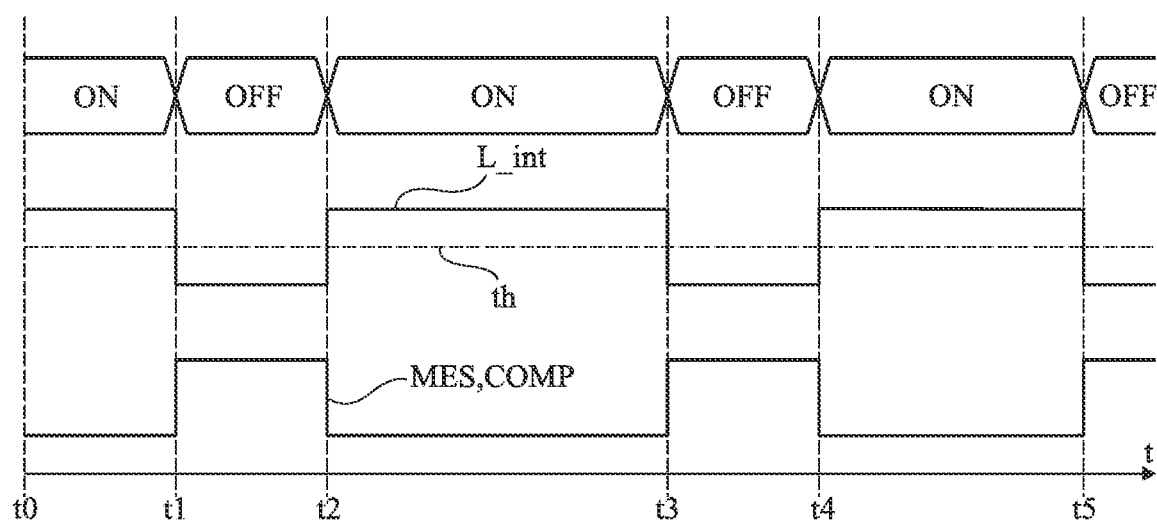
FIG. 4 is a timing diagram illustrating a mode of operation of the sensor of FIG. 3 according to an embodiment.

FIG. 4 is a timing diagram illustrating a mode of operation of the sensor 104 of FIG. 3 according to an embodiment. In the embodiment of FIG. 4, the signal MES is identical to the signal COMP.

At an instant t0, the screen 100 is controlled to be in a phase ON in which light is emitted by screen 100. As a part of the emitted light is received by the sensor 104, the signal L_int has a value superior to the threshold intensity value th. Thus, the signal COMP and the signal MES, which are here identical to each other, are in their second states, in this example low states.

The screen 100 is in the ON-phase until an instant t1 posterior to the instant t0. At the instant t1, the screen 100 is switched to a phase OFF in which no light is emitted by the screen 100. As no light emitted by the screen can be received by the sensor 104, the value of the signal L_int decreases and becomes inferior to the threshold intensity value th. Thus, the signals COMP and MES transition to their first states, in this example high states.

The screen 100 is in the OFF-phase until an instant t2 posterior to the instant t1. At the instant t2, the screen is switched to an ON-phase. The value of the signal L_int increases and becomes superior to the threshold intensity value th. Thus, the signals COMP and MES transition to their second states.

The screen 100 is in the ON-phase until an instant t3 posterior to the instant t2. At the instant t3, the screen is switched to an OFF-phase, the signal L_int drops below the threshold intensity value th, and the signals COMP and MES transition to their first states.

The screen 100 is in the OFF-phase until an instant t4 posterior to the instant t3. At the instant t4, the screen is switched to an ON-phase, the signal L_int goes above the threshold intensity value th, and the signals COMP and MES transition to their second states.

The screen 100 is in the ON-phase until an instant t5 posterior to the instant t4. At the instant t5, the screen is switched to an OFF-phase, the signal L_int drops below the threshold intensity value th, and the signals COMP and MES transition to their first states.

In the embodiment of FIG. 4, each transition of the signal MES to its first state triggers a start of a corresponding ambient light measurement phase (instants t1, t3 and t5), and each transition of the signal MES to its second state ends a corresponding ambient light measurement phase (instants t2 and t4). In other words, each ambient light measurement is performed from a transition of the signal COMP to its first state, until the immediately following or next transition of the signal COMP to its second state.

Thus, in the embodiment of FIG. 4, the duration of an ambient light measurement phase triggered by a given transition of the signal MES to its first state is determined by a corresponding duration of the first state of the signal MES, that is to say the duration of the first state of the signal MES following this given transition. In this way, each ambient light measurement phase is performed during a corresponding OFF-phase.

Although three successive ON-phases, which alternate with three successive OFF-phases, have been represented in FIG. 4, the sensor 104 is configured to operate in the manner described above whatever the number of alternating ON-phases and OFF-phases.

Figure 5:
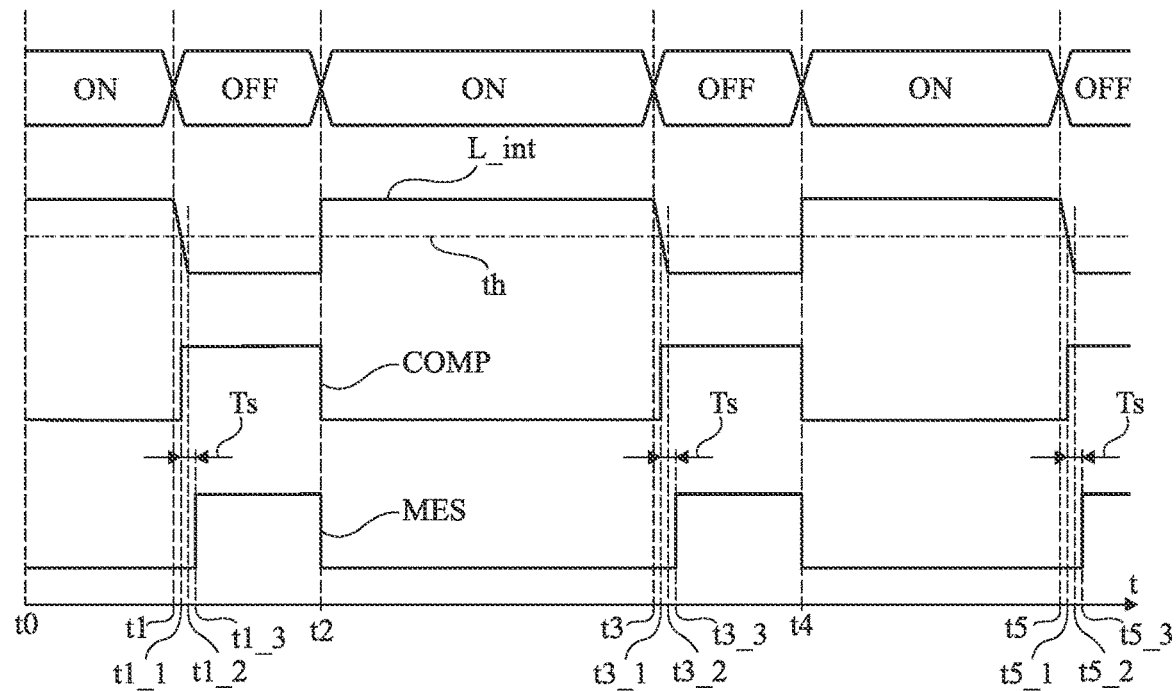
FIG. 5 is a timing diagram illustrating a mode of operation of the sensor of FIG. 3 according to a further embodiment.

FIG. 5 is a timing diagram illustrating a mode of operation of the sensor 104 of FIG. 3 according to a further embodiment.

More particularly, in this embodiment, it is considered that, when the screen 100 switches from an ON-phase to an OFF-phase, due to the afterglow of the screen 100, the intensity of the light emitted by the screen decreases progressively between a high value at the end of the ON-phase and a null value, which is reached during the OFF-phase. Thus, the transition of the signal COMP may occur even when the intensity of the light emitted by the screen is not yet null.

In this embodiment, an ambient light measurement phase starts a given time delay Ts after a transition of the signal COMP to its first state, the time delay Ts being chosen such that, at the start of the ambient light measurement, the intensity of light emitted by the screen 100 is null. Thus, the time delay is determined based on the duration of the afterglow of the screen. For example, the time delay Ts is in the range 0.1 µs to 100 µs.

In FIG. 5, as in FIG. 4, at the instant to, the screen 100 is in an ON-phase, the signal L_int being thus above the threshold intensity value th, and the signals COMP and MES being in their second states.

In FIG. 5, as in FIG. 4, at the instant t1, the screen 100 is switched to an OFF-phase. The intensity of the light emitted by the screen 100 then decreases progressively to reach a null value at an instant t1_2 posterior to the instant t1. As a consequence, the signal L_int decreases from the instant t1 to the instant t1_2, and drops below the threshold intensity value th at an instant t1_1 between the instants t1 and t1_2. It results that signal COMP transitions to its first state at the instant t1_1, whereas the intensity of the light emitted by the screen 100 is not yet null. However, the signal MES is transitioned to its first state, by circuit 1047, the time delay Ts after the instant t1_1, at an instant t1_3 posterior to the instant t1_2 and equal to t1_1+Ts. Thus, when an ambient light measurement phase starts at the instant t1_3 because of the transition of the signal MES to its first state, the intensity of the light emitted by the screen is null.

At the instant t2 posterior to the instant t1_3, the screen 100 is switched to an ON-phase, the signal L_int goes above the threshold intensity value th, and the signals COMP and MES transition to their second states.

At the instant t3 posterior to the instant t2, the screen 100 is switched to an OFF-phase. The sensor 104 then operates at successive instants t3_1, t3_2 and t3_3 in a manner identical to that described in relation with the respective instants t1_1, t1_2 and t1_3, the instant t3_3 being thus equal to t3_1+Ts.

At the instant t4 posterior to the instant t3_3, the screen 100 is switched to an ON-phase, the signal L_int goes above the threshold intensity value th, and the signals COMP and MES transition to their second states.

At the instant t5 posterior to the instant t4, the screen 100 is switched to an OFF-phase. The sensor 104 then operates at successive instants t5_1, t5_2 and t5_3 in a manner identical to that described in relation with the respective instants t1_1, t1_2 and t1_3, the instant t5_3 being thus equal to t5_1+Ts.

Although three successive ON-phases, which alternate with three successive OFF-phases, have been represented in FIG. 5, the sensor 104 is configured to operate in the manner described above whatever the number of alternating ON-phases and OFF-phases.

In the embodiments of FIGS. 4 and 5, each transition of the signal COMP to its first state triggers, possibly after the time delay Ts, a corresponding ambient light measurement, and the next transition of the signal COMP to its second state ends the measurement phase. Thus, the duration of the measurement phase is determined by the duration of the first state of the signal COMP following the transition of the signal COMP which triggers the measurement phase.

In alternative embodiments, each transition of the signal COMP to its first state triggers the start of a corresponding ambient light measurement phase, but the duration of this measurement phase is controlled based on at least one duration of the first state of the signal COMP occurred before this measurement phase. In other words, the duration of this measurement phase is controlled based on at least one duration of the first state of the signal COMP that occurred before the transition of the signal COMP that triggered this measurement phase.

Figure 6:
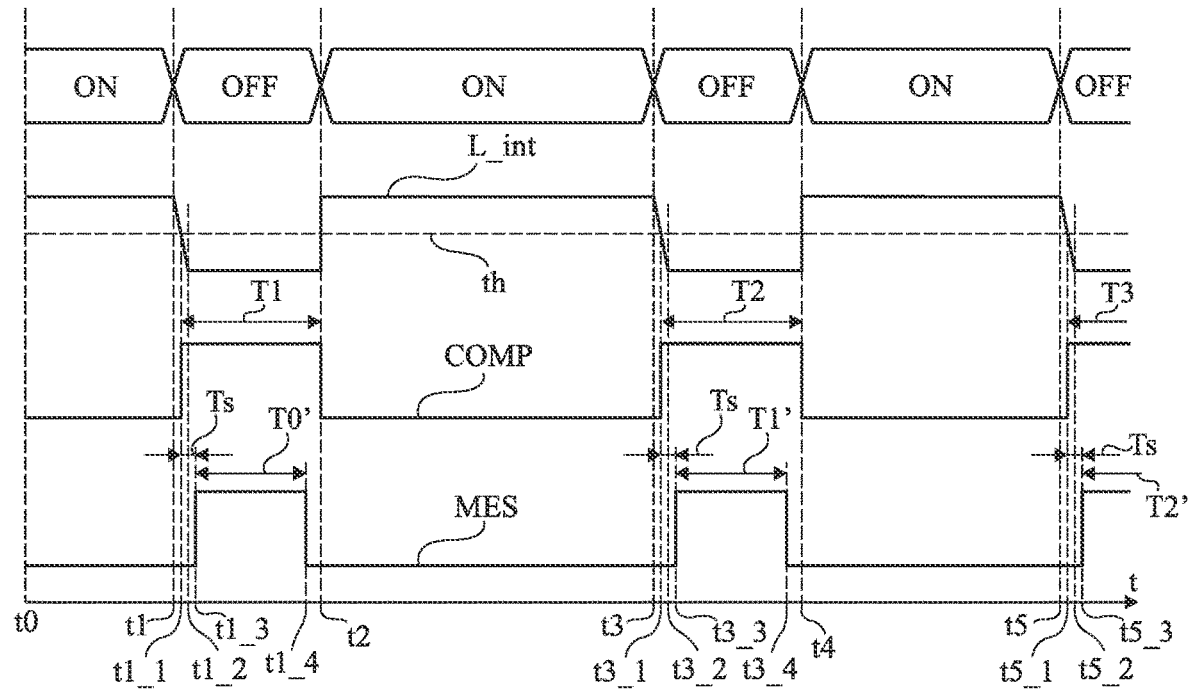
FIG. 6 is a timing diagram illustrating a mode of operation of the sensor of FIG. 3 according to yet a further embodiment.

FIG. 6 is a timing diagram illustrating a mode of operation of the sensor 104 of FIG. 3 according to a further embodiment, in which the duration of an ambient light measurement phase is determined based on at least one previous duration of the first state of signal COMP, in this example by the immediately preceding duration of the first state of signal COMP.

In FIG. 6, as in FIGS. 4 and 5, at the instant to, the screen 100 is in an ON-phase, the signal L_int being thus above the threshold intensity value th, and the signals COMP and MES being in their second states. Furthermore, an information representative of the duration T0 (not shown on FIG. 6) of the last first state of the signal COMP before the instant to has been stored by the circuit 1047, for example in a memory of the circuit 1047.

At the instant t1, the screen 100 is switched to an OFF-phase, and the signal L_int decreases progressively to reach a null value at the instant t1_2, the signal L_int dropping below the threshold intensity value th at the instant t1_1 between the instants t1 and t1_2.

Because the signal L_int drops below the threshold th at the instant t1_1, the signal COMP transitions to its first state at the instant t1_1. The transition of the signal COMP to its first state causes the signal MES to transition to its first state, in this example at the instant t1_3 separated from the instant t1_1 by the time delay Ts. Furthermore, the signal MES is maintained at its first state for a duration T0' inferior to the duration T0, such that the signal MES transitions to its second state, while the screen 100 is still in the OFF-phase. Thus, during the OFF-phase between the instants t1 and t2, the duration of the measurement phase performed is thus T0'.

In this example, the duration T0' is equal to T0−Ts−Te, Te being a given time duration. The time duration Te is chosen such that, at the end of the time duration T0', when the signal MES is transitioned to its second state at an instant t1_4 equal to t1_3+T0', the screen 100 is still in the OFF-phase.

The subtraction of the duration Te from the previous duration T0 allows to ensure that the ambient light measurement phase ends before the next ON-phase in which light is emitted by screen, even in case where the signal COMP transition to its second state with a delay compared to the instant at which the signal L_int goes above the threshold intensity value th.

Moreover, between the instants t1 and t2, the circuit 1047 obtains or generates an information representative of a duration T1 of the first state of the signal COMP between these instants, and stores this information.

At the instant t3, the screen 100 is switched to an OFF-phase, and the signal L_int decreases progressively to reach a null value at the instant t3_2, the signal L_int dropping below the threshold intensity value th at the instant t3_1 between the instants t3 and t3_2. Thus, the signal COMP transitions to its first state at the instant t3_1, and the signal MES is transitioned to its first state, in this example at the instant t3_3 equal to t3_1+Ts. The signal MES is then maintained at its first state for a duration T1' inferior to the duration T1, at least by the time duration Te, and, more precisely in this example, for a time duration T1' equal to T1−Ts−Te. The signal MES is transitioned to its second state at an instant t3_4 equal to t3_3+T1', while the screen 100 is still in the OFF-phase, which ends at the instant t4 posterior to the instant t3_4. Thus, during the OFF-phase between the instants t3 and t4, the duration of the measurement phase performed is T1'.

Moreover, information representative of a duration T2 of the first state of signal COMP between the instants t3_1 and t4 is stored by the circuit 1047.

At the instant t5, the screen 100 is switched to an OFF-phase, and the signal L_int decreases progressively to reach a null value at the instant t5_2, the signal L_int dropping below the threshold intensity value th at the instant t5_1 between the instants t5 and t5_2. Thus, the signal COMP transitions to its first state at the instant t5_1, and the signal MES is transitioned to its first state, in this example at the instant t5_3 equal to t5_1+Ts. The signal MES is then maintained at its first state for a duration T2' inferior to the duration T2, at least by the time duration Te, and, more precisely in this example, for a time duration T2' equal to T2−Ts−Te. The signal MES is transitioned to its second state at an instant (not shown) equal to t5_3+T2', while the screen 100 is still in the OFF-phase. Thus, the duration of the measurement phase performed during the OFF-phase starting at the instant t5 is T2'.

Moreover, information representative of a duration T3 of the first state of signal COMP starting at the instant t5_1 is stored by the circuit 1047.

Although three successive ON-phases, which alternate with three successive OFF-phases, have been represented in FIG. 6, the sensor 104 is configured to operate in the manner described above whatever the number of alternating ON-phases and OFF-phases.

In an alternative embodiment, the duration of an ambient light measurement phase following a given transition of the signal COMP to its first state is determined based on several previous durations of the first state of the signal COMP. For example, the duration T2' of the ambient light measurement phase following the transition of signal COMP to its first state at the instant t5 is determined based on the durations T0, T1 and T2, the duration T2' being for example equal to Tmean−Te−Ts, with Tmean the mean value of durations T0, T1 and T2.

In the embodiment of FIG. 6, the information representative of a duration of the first state of the signal COMP is for example output by a counter, which is configured to count a number of cycles of a periodic signal, for example, a clock signal, while the signal COMP is in its first state. The period of the periodic signal is, for example, at least 10 times shorter than the minimal duration of an OFF-phase, preferably at least 100 times shorter than the minimal duration of an OFF-phase. The duration of a measurement phase could then correspond to the duration of a given number of successive cycles of the periodic signal, for example a number of successive cycles equal to the number of cycles counted during the previous first state of signal COMP, from which a number of cycles corresponding to the time duration Te, and, possibly, a number of cycles corresponding to the time duration Ts have been subtracted. Thus, when signal COMP switches to its first state, the signal MES is switched to its first state after a number of cycles corresponding to the time duration Te, the signal MES being then switched to its second state at the end of the duration of the measurement phase, which was determined as described above.

In the embodiment of FIG. 6, the signal MES is for example generated by using at last one phase-locked loop of the circuit 1047.

For example, one phase-locked loop is locked on the transitions of the signal COMP to its first state, and one phase-locked loop is locked on the transitions of the COMP signal to its second state, the output signal of the two phase-locked loops being used to generate a corresponding signal MES. In this case, the information representative of the duration of the first state of the signal COMP corresponds to a phase difference between the two outputs of the phase-locked loops, and is stored inside the circuit 1047 by the phase-locked loops themselves.

As another example, a single phase-locked loop is locked on transitions of the signal COMP to its second state. For example, the phase locked loop comprises a voltage-controlled oscillator, the output signal of which being delayed by the time duration Te, and a phase detector outputting a signal representative of the phase difference between transitions of the delayed signal to its second state and transitions of the COMP signal to its second state. The output signal of the phase detector is used, possibly after being filtered by a low-pass filter, to control the voltage-controlled oscillator, thus to control the phase and/or the frequency of the output signal of the voltage-controlled oscillator. The transitions of the signal COMP to its first state are used, preferably after being delayed by the time duration Ts, to switch the signal MES to its first state, and the transitions of the output signal of the voltage-controlled oscillator to its second state are used to switch the signal MES to its second state. For example, the delayed signal COMP is provided to a set input of a RS type latch, the output signal of the voltage-controlled oscillator is provided to a reset input of the latch, and the signal MES is provided by an output of the latch.

Figure 7:
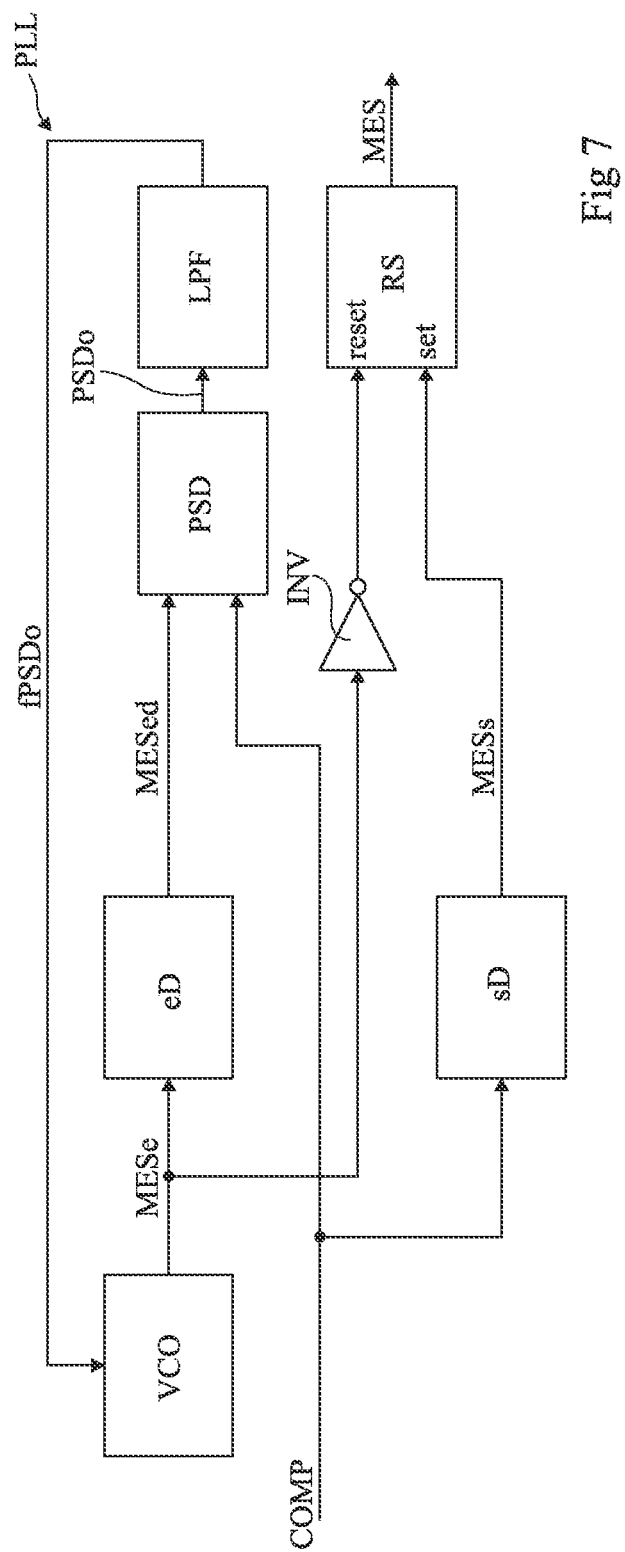
FIG. 7 schematically illustrates, in the form of blocks, a circuit according to an example embodiment.

FIG. 7 illustrates, in the form of blocks, a circuit configured to generate the signal MES based on the COMP signal using a single phase-locked loop, according to an example embodiment of the type described above.

The phase-locked loop PLL comprises a voltage-controlled oscillator VCO, a delay circuit eD, a phase shift detector circuit PSD, and, in this example, a low-pass filter LPF.

The oscillator VCO provides a MESe signal to the delay circuit eD.

The delay circuit eD applies a delay equal to the time duration Te to the signal MESe, the resulting delayed signal MESed being provided by the circuit eD.

The circuit PSD receives the MESed signal and the COMP signal and provides a signal PSDo representative of the phase shift between signals MESed and COMP.

The circuit VCO is controlled based on the signal PSDo such that, in stationary operation, the switching of the signal MESed to its second state are synchronized with the switching of the COMP signal to its second state. More particularly, in this example, the signal PSDo is provided to the filter LPF, and the resulting filtered signal fPSDo is the control signal of the circuit VCO.

Moreover, the COMP signal is delayed by the time duration Ts by a delay circuit sD which provides a delayed signal MESs.

The signal MES is then generated based on the MESe and MESs signals. In this example, this is done using a RS type latch RS, an output of which providing the MESe signal. A reset input of the latch RS receives the signal MESe inverted by an inverter circuit INV, a set input of the latch RS receiving the signal MESs.

FIG. 8 is a timing diagram illustrating a mode of operation of the circuit of FIG. 7. FIG. 8 shows the evolution of signals COMP, MESs, MESe, MESed and MES.

As it can be seen, the signal MES switches to its first state when the signal MESs, thus the signal COMP delayed by the time duration Ts, switches to its first state, and switches to its second state when the signal MESe switches to its second state. Thus, the signal MES switches to its first state with a delay equal to the duration Te after a corresponding switching of the COMP signal to its first state, and to its second state with a time advance equal to the time duration Te before a corresponding switching of the signal COMP to its second state.

In another alternative embodiment, a filtering function is applied to the value of each duration of the first state of the signal COMP to remove values that are relatively far from the previous values, for example to remove a value that differs from at least one previous value by more than 10%. This alternative embodiment is compatible with all the embodiments described in relation with FIG. 6.

In another alternative embodiment, each transition of the signal COMP to its first state is not delayed by the time duration Ts after a corresponding transition of the signal MES to its first state. Thus, in this case, the time duration Ts is not subtracted from the previous duration of the first state of signal COMP. This alternative embodiment is compatible with all the embodiments described in relation with FIG. 6.

In another alternative embodiment, a value representative of the amount of light received by the sensor 104 during a given ambient light measurement phase is weighted by the duration of this measurement phase, for example, by dividing this value by the duration of the measurement phase or by a number of cycles of a periodic signal representative of this duration. The signal OUT provided at the end of the measurement is then representative of the weighted value. This allows the ambient light to be measured without being sensitive to the fact that different ambient light measurement phases could have different durations. This alternative embodiment is compatible with all the embodiments described in relation with FIGS. 4,5 and 6.

In another alternative embodiment, the circuit 1047 is further configured to detect when a current ambient light measurement phase ends during on ON-phase of the screen 100, for example by comparing the states of signals COMP and MES and detecting when the signal MES is at its first state while the signal COMP is at its second state. The result of this detection can be output by the sensor 104, for example in order to validate or invalidate an output value of the signal OUT. The generation of an output value of the signal OUT could also be conditioned by the results of this detection, in order to ensure that only values of the signal OUT corresponding to ambient light measurements integrally performed during corresponding OFF-phases are output. This alternative embodiment is compatible with all the embodiments described in relation with FIG. 6.

As an example, in the embodiments described above, each ON-phase has a duration comprised between 1 ms and 10 ms, and each OFF-phase has a duration comprised between 50 µs and 500 µs.

The embodiments described above in relation with FIGS. 3, 4, 5, 6, 7 and 8 allow to synchronize an ambient light measurement phase with a corresponding OFF-phase of a screen alternating between OFF-phases and ON-phases. This synchronization is done without the use of a signal controlling the switching of the screen between the OFF-phases and the ON-phases, or a signal derived from this control signal. Compared to the embodiments described above, the use of such a signal would require an additional input pin for the sensor 104, and would lead to issues because of the unknown and uncontrolled time delay occurring in these signals.

It is particularly interesting to implement the above-described embodiments in electronic devices comprising an ambient light sensor 104 disposed below a screen 100 and without a notch or window above the light sensor 104. However, the embodiments described here could also be implemented in the case where the screen 100 comprises such a notch or window above the sensor 104. Indeed, even with such a notch or window, an ambient light measurement at least partly performed during an ON-phase of the screen will be distorted by the light emitted by the screen 100.

Various embodiments and variants have been described. Those skilled in the art will understand that certain features of these embodiments can be combined and other variants will readily occur to those skilled in the art. In particular, when it has been indicated that the first state, respectively the second state, of a binary signal corresponds to a high state, respectively to a low state, of this signal, those skilled in the art are capable of adapting the described embodiments to the case where the first state, respectively the second state, of this signal corresponds to the low state, respectively to the high state, of this signal. Furthermore, although the value of the signal L_int described above increases, respectively decreases, when the intensity of the light received by the sensor 104 increases, respectively decreases, those skilled in the art are capable of adapting the described embodiments to the case where the value of the signal L_int described above increases, respectively decreases, when the intensity of the light received by the sensor 104 decreases, respectively increases.

Finally, the practical implementation of the embodiments and variants described herein is within the capabilities of those skilled in the art based on the functional description provided hereinabove. In particular, the implementation of the read circuit 1043 and/or the implementation the control circuit 1047 and/or the choice of the value Ts and/or the choice of the value Te are within the capabilities of those skilled in the art based on the functional description provided hereinabove.

What is claimed is:

1. A method of measuring ambient light comprising:
   generating, by an ambient light sensor associated with a screen that alternates between first phases in which light is emitted by the screen, a part of which is received by the ambient light sensor, and second phases in which no light is emitted by the screen, a first signal representative of an intensity of light received by the ambient light sensor during the first and second phases;
   comparing the first signal with a threshold intensity value, the comparing comprising:
      generating a second signal having a first state in response to the intensity of the light received by the ambient light sensor being below the threshold intensity value, and a second state in response to the intensity of the light received by the ambient light sensor being above the threshold intensity value; and
      determining the threshold intensity value such that the second signal is in the first state during each second phase, and in the second state during each first phase; and
   controlling a timing of an ambient light measurement by the ambient light sensor based on the comparison, a start of the measurement being triggered by at least one transition of the second signal to the first state such that the measurement starts when the second signal is in the first state, and a duration of the measurement is controlled based on at least one duration of the first state of the second signal.

2. The method according to claim 1, wherein the measurement starts following a first transition of the second signal to the first state.

3. The method according to claim 2, wherein the measurement starts a time delay between 0.1 us and 100 us after the first transition.

4. The method according to claim 2, wherein the first transition triggers the start of the measurement, and a next transition of the second signal to the second state following the first transition ends the measurement.

5. The method according to claim 2, wherein the duration of the measurement is controlled based on at least one previous duration of the first state of the second signal.

6. The method according to claim 5, wherein the duration of the measurement is controlled to be shorter than the at least one previous duration of the first state of the second signal.

7. The method according to claim 5, wherein the duration of the measurement is controlled based on an average value of at least two successive previous durations of the first state of the second signal.

8. The method according to claim 5, wherein the at least one previous duration of the first state of the second signal comprises the previous duration of the first state of the second signal immediately preceding the first state of the second signal during which the measurement starts.

9. The method according to claim 5, further comprising counting a number of clock cycles with a counter during the at least one previous duration of the first state of the second signal, the duration of the measurement being controlled based on the counted number of clock cycles.

10. The method according to claim 9, wherein the duration of the measurement is equal to a duration of a first number of successive clock cycles, the first number being lower than the counted number of clock cycles.

11. The method according to claim 1, wherein the first signal is generated based on an output signal of at least one pixel of a plurality of pixels of the ambient light sensor.

12. An ambient light sensor associated with a screen that alternates between first phases in which light is emitted by the screen, a part of which is received by the ambient light sensor, and second phases in which no light is emitted by the screen, the ambient light sensor comprising:
   electronic circuitry configured to:
      generate a first signal representative of an intensity of light received by the ambient light sensor during the first and second phases;
      compare the first signal with a threshold intensity value, the compare comprising the electronic circuitry configured to:
         generate a second signal having a first state in response to the intensity of the light received by the ambient light sensor being below the threshold intensity value, and a second state in response to the intensity of the light received by the ambient light sensor being above the threshold intensity value; and
         determine the threshold intensity value such that the second signal is in the first state during each second phase, and in the second state during each first phase; and
      control a timing of an ambient light measurement by the ambient light sensor based on the comparison, wherein a start of the measurement is triggered by at least one transition of the second signal to the first state such that the measurement starts when the second signal is in the first state, and a duration of the measurement is controlled based on at least one duration of the first state of the second signal.

13. The ambient light sensor of claim 12, wherein the electronic circuitry is configured to start the measurement following a first transition of the second signal to the first state.

14. The ambient light sensor of claim 12, wherein the first signal is generated based on an output signal of at least one pixel of a plurality of pixels of the ambient light sensor.

15. The ambient light sensor of claim 12, wherein the measurement starts following a first transition of the second signal to the first state.

16. An electronic device comprising:
   a screen;
   a screen driver configured to control the screen to alternate between first phases in which light is emitted by the screen and second phases in which no light is emitted by the screen; and
   an ambient light sensor disposed such that a part of the light emitted by the screen is received by the ambient light sensor, the ambient light sensor comprising:

electronic circuitry configured to:
  generate a first signal representative of an intensity of light received by the ambient light sensor during the first and second phases;
  compare the first signal with a threshold intensity value, the compare comprising the electronic circuitry configured to:
    generate a second signal having a first state in response to the intensity of the light received by the ambient light sensor being below the threshold intensity value, and a second state in response to the intensity of the light received by the ambient light sensor being above the threshold intensity value; and
    determine the threshold intensity value such that the second signal is in the first state during each second phase, and in the second state during each first phase; and
  control a timing of an ambient light measurement by the ambient light sensor based on the comparison, wherein a start of the measurement is triggered by at least one transition of the second signal to the first state such that the measurement starts when the second signal is in the first state, and a duration of the measurement is controlled based on at least one duration of the first state of the second signal.

17. The electronic device of claim 16, wherein the ambient light sensor is disposed at a first side of the screen opposite a second side of the screen from which the light is emitted.

18. The electronic device of claim 17, wherein a transmittance of ambient light through the screen is in a range from 0.5% to 5% when no light is emitted by the screen.

19. The electronic device of claim 16, wherein the electronic circuitry is configured to start the measurement following a first transition of the second signal to the first state.

20. The electronic device of claim 16, wherein the first signal is generated based on an output signal of at least one pixel of a plurality of pixels of the ambient light sensor.

21. The electronic device of claim 16, wherein the measurement starts following a first transition of the second signal to the first state.

* * * * *